United States Patent
Matterazzo et al.

(10) Patent No.: US 11,802,902 B2
(45) Date of Patent: Oct. 31, 2023

(54) UNDERWATER STORAGE TANK, SYSTEM OF ASSESSING THE PHYSICAL INTEGRITY OF AN UNDERWATER TANK, METHOD FOR DETECTING A LOSS OF PHYSICAL INTEGRITY OF AN UNDERWATER STORAGE TANK

(71) Applicant: SAIPEM S.P.A., San Donato Milanese (IT)

(72) Inventors: Sandro Matterazzo, San Donato Milanese (IT); Yvan Albani, San Donato Milanese (IT)

(73) Assignee: SAIPEM S.P.A., San Donato Milanese (IT)

( * ) Notice: Subject to any disclaimer, the term of this patent is extended or adjusted under 35 U.S.C. 154(b) by 0 days.

(21) Appl. No.: 17/632,797

(22) PCT Filed: Aug. 3, 2020

(86) PCT No.: PCT/IB2020/057334
§ 371 (c)(1),
(2) Date: Feb. 4, 2022

(87) PCT Pub. No.: WO2021/024166
PCT Pub. Date: Feb. 11, 2021

(65) Prior Publication Data
US 2023/0023109 A1    Jan. 26, 2023

(30) Foreign Application Priority Data

Aug. 7, 2019  (IT) .................. 102019000014271

(51) Int. Cl.
*G01R 31/14* (2006.01)
*G01R 31/12* (2020.01)
(Continued)

(52) U.S. Cl.
CPC ......... *G01R 31/1263* (2013.01); *B65D 88/78* (2013.01); *G08B 21/182* (2013.01)

(58) Field of Classification Search
CPC .. G01R 31/1263; G01N 27/20; G01N 27/205; G01N 27/226; G01N 27/227;
(Continued)

(56) References Cited

U.S. PATENT DOCUMENTS 5,553,734 A  *  9/1996  Sharp .................. B65D 90/022
                                                    220/62.19
9,656,801 B2     5/2017  Chitwood et al.
(Continued)

FOREIGN PATENT DOCUMENTS

| DE | 9311620 U1 | 10/1993 |
| DE | 10302308 B3 | 3/2004 |
| WO | 2016116625 A1 | 7/2016 |

OTHER PUBLICATIONS

International Search Report and Written Opinion issued in PCT/IB2020/057334, dated Oct. 6, 2020, 10 Pages.

*Primary Examiner* — Thang X Le
(74) *Attorney, Agent, or Firm* — Armstrong Teasdale LLP

(57) ABSTRACT

An underwater storage tank having a flexible multilayer tank containing a working liquid is provided. The flexible multilayer tank has at least one internal electrical insulating layer in contact with the working fluid, at least one external electrical insulating layer in contact with sea water, and at least one intermediate electric conductive layer sealed between the at least one internal electrical insulating layer and the at least one external electrical insulating layer. At least one first electrical connection means is connected to the at least one intermediate electric conductive layer, the least one first electrical connection means being electrically con-
(Continued)

nectable to an electrical grounded measurement instrument to assess physical integrity of the flexible multilayer tank.

13 Claims, 4 Drawing Sheets

(51) Int. Cl.
*B65D 88/78* (2006.01)
*G08B 21/18* (2006.01)

(58) Field of Classification Search
CPC .. B65D 90/046; B65D 90/501; B65D 90/505; B65D 90/513; B65D 88/76; B65D 88/78; B65D 2590/046; G08B 21/182
See application file for complete search history.

(56) References Cited

U.S. PATENT DOCUMENTS

| | | | |
|---|---|---|---|
| 10,994,276 B2 * | 5/2021 | Ried | B01L 7/00 |
| 2007/0220956 A1 | 9/2007 | Terentiev | |
| 2009/0188211 A1 * | 7/2009 | Galliher | C12M 23/14 |
| | | | 53/434 |
| 2009/0269530 A1 * | 10/2009 | Schmidt | B65D 11/06 |
| | | | 428/36.7 |
| 2015/0245454 A1 * | 8/2015 | Steinberg | H05K 13/00 |
| | | | 156/245 |
| 2018/0087845 A1 * | 3/2018 | De Groot | B65D 88/76 |
| 2021/0086987 A1 * | 3/2021 | Berg | B65D 88/76 |

* cited by examiner

UNDERWATER STORAGE TANK, SYSTEM OF ASSESSING THE PHYSICAL INTEGRITY OF AN UNDERWATER TANK, METHOD FOR DETECTING A LOSS OF PHYSICAL INTEGRITY OF AN UNDERWATER STORAGE TANK

CROSS-REFERENCE TO RELATED APPLICATIONS

This application is a U.S. National Phase filing of PCT International Patent Application No. PCT/IB2020/057334, having an international filing date of Aug. 3, 2020, which claims priority to Italian Patent Application No. 102019000014271, filed Aug. 7, 2019 each of which is hereby incorporated by reference in its entirety.

TECHNICAL FIELD OF THE INVENTION

The present invention is applicable to the field of oil & gas, for the underwater storage of chemical products.

BACKGROUND ART

Storage tanks of chemical products are used in the underwater field, the tanks being made of flexible elements so that as the stored chemical products are drawn, the tank is deformed, substantially keeping null the difference in pressure between the inner wall and the outer wall of the flexible tank.

A very popular type of underwater storage tank is a bag-type flexible tank positioned in a metal protective and containment structure.

In certain cases, the protective and containment structure is a metal reticular structure which therefore allows the sea water to always be in contact with the flexible tank, keeping it under a condition of hydrostatic pressure.

In other cases, the protective and containment structure is made in the shape of a rigid tank, in which the flexible tank is contained and which has at least one inlet for the sea water to compensate for the decrease in volume of the flexible tank upon the withdrawal of chemical product.

In addition to compensating for the bathymetric pressure on the flexible tank, the protective and containment structure also acts as physical protective barrier with respect to possible damage of the flexible tank due to blows, for example in the laying and/or withdrawal operations and/or from interactions with aquatic animals.

However, the flexible tank is exposed to further risks of degradation and/or breakage which could result in leaks of the chemical product content, with subsequent economic damage and environmental damage due to the dispersion of the chemical product into the marine environment.

A need which is felt in the field therefore is the one of promptly detecting structural damage to the flexible tanks which may cause possible leaks of chemical product so as to promptly intervene to limit the economic and environmental damage.

Document U.S. Pat. No. 9,656,801, for example, describes the use of a detection sensor which detects the presence or absence of chemical product leaks through an analysis of the water about a flexible tank containing a chemical product. However, such sensors are not universally applicable to any chemical product because they are highly dependent on the nature of the chemical composition of the chemical product contained. Therefore, pH measuring sensors with specific selected measurement electrodes are used to measure acidic or basic chemical product leaks, while in order to measure chemical product leaks of aromatic nature there are used infrared measurement sensors which are very expensive and often not adapted to take measurements at great depths due to technological limitations.

Moreover, in addition to not being very versatile, being highly costly and often unavailable, such sensors detect a chemical product leak once the tank is broken and therefore are inadequate for being used within the scope of damage prevention.

Therefore, the need is felt to make underwater tanks having reduced environmental impact and increased safety.

Prior art document WO 2016/116625 describes a system for the subsea storage of crude oil, which however may not be applied for fluids with density greater than water because the flexible container would rest on the bottom without being able to be emptied.

Prior art document DE 10302308 B3 describes a system dedicated to storing exclusively an electrically conductive liquid and to detecting fluid leaks, but not also for identifying possible contamination of the stored fluid, for example by the sea water; moreover, due to how the system is structured, the detection is only allowed if the leak is at the welds of the liner positioned in the rigid container. The outer rigid container appears to be essential for the operation thereof. High-pressure subsea application is not possible.

Prior art document DE 9311620 U1 describes a lining based on thermoplastic or rubber materials for covering containers, boilers, wastewater treatment plants, storage reservoirs, columns, and pipes.

Prior art document US 2007/220956 describes equipment for identifying leaks of an electrically conductive fluid from a disposable plastic bag.

SUMMARY OF THE INVENTION

The inventors of the present Patent Application have found that the integrity of an underwater storage tank of chemical products may be monitored so as to intervene prior to the occurrence of possible leaks by means of a flexible multilayer tank, in which the flexible tank comprises an intermediate electric conductive layer sealed between two electrically insulating layers, and first electrical connection means connected to the intermediate conductive layer which is connectable to a grounded electrical measurement instrument to assess the physical integrity of the flexible multilayer tank.

OBJECT OF THE INVENTION

Therefore, a first object of the present invention is an underwater storage tank for a working liquid.

A second object of the present invention relates to an assessment system of the physical integrity of an underwater tank.

Another object of the present invention is to provide methods for detecting the integrity of an underwater storage tank of a working liquid.

DETAILED DESCRIPTION OF THE INVENTION

Figure 1A:
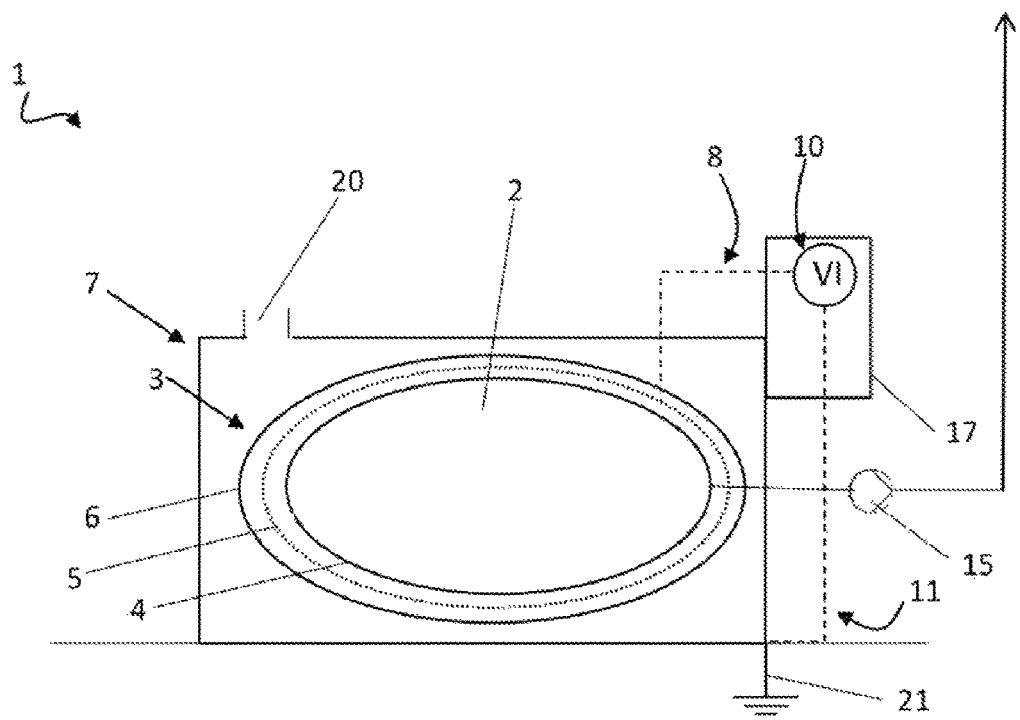
FIGS. 1a and 1b diagrammatically show an underwater tank according to the present invention, in two different loading configurations of a working liquid.
Figure 1B:
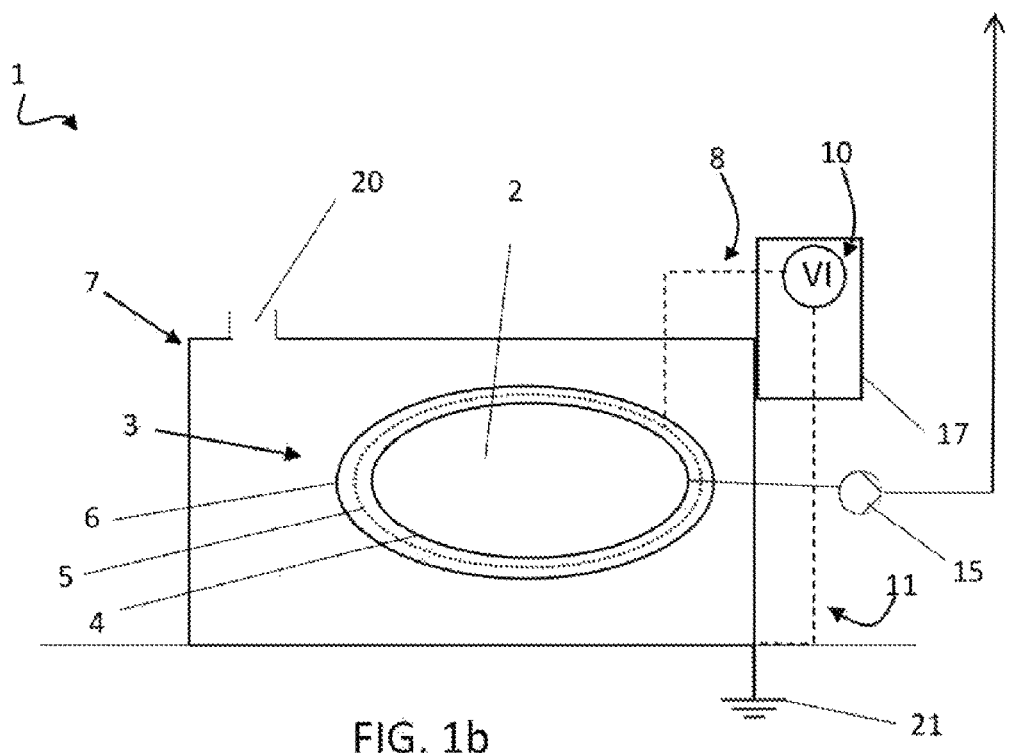

According to a first object, an underwater storage tank of a working liquid is described.

In particular, with reference to the Figures, an underwater storage tank of a working liquid 2 is generically identified with reference numeral 1.

The underwater storage tank 1 comprises a flexible multilayer tank 3 which contains said working liquid 2.

According to an embodiment, said flexible multilayer tank 3 is a tank referred to as a bladder.

According to an embodiment, said underwater storage tank 1 comprises a pump 15 connected to said flexible tank 3 by means of at least one duct for withdrawing or reloading said working fluid 2.

According to an embodiment, said duct comprises a metal flange in contact with said working fluid 2, connected to said flexible tank 3.

In this text, sea water means any water of a body of water, such as e.g. an ocean, a sea, a lake, or a river.

The flexible multilayer tank 3 comprises at least one internal electrical insulating layer 4, an external electrical insulating layer 6 and an intermediate electric conductive layer 5 sealed between the inner layer 4 and the outer layer 6.

The internal electrical insulating layer 4 is in contact with the working fluid 2 and the external electrical insulating layer 6 is in contact with the sea water.

The underwater storage tank 1 comprises at least a first electrical connection means 8 connected to the intermediate conductive layer 5.

The first electrical connection means 8 is connectable to an electrical grounded measurement instrument 10 to assess the physical integrity of the flexible multilayer tank 3.

In certain embodiments, the flexible multilayer tank 3 comprises further layers, e.g. adhesive layers, interposed between the intermediate layer 5 and the inner layer 4 and the outer layer 6, respectively.

It is worth noting that the electric conductive layer 5 has a first electric potential known under conditions of integrity of the flexible multilayer tank 3.

In particular, said at least one measurement instrument 10 comprises a positive pole and a negative pole.

According to an embodiment, the positive pole is electrically connectable to the intermediate electric conductive layer 5 and the negative pole is electrically connected to a grounding system 21.

According to an embodiment, the intermediate electric conductive layer 5 is a layer which is seamlessly interposed between the internal electrical insulating layer 4 and the external electrical insulating layer 6.

Advantageously, a loss of integrity of the external electrical insulating layer 6 places at least one portion of the intermediate electric conductive layer 5 in contact with the sea water, and therefore said at least one electrical measurement instrument 10 connected to a ground once connected to the first electrical connection means 8 may detect a variation of the passage of electric current, and therefore detect said loss of integrity of the flexible multilayer tank 3.

Figure 4:
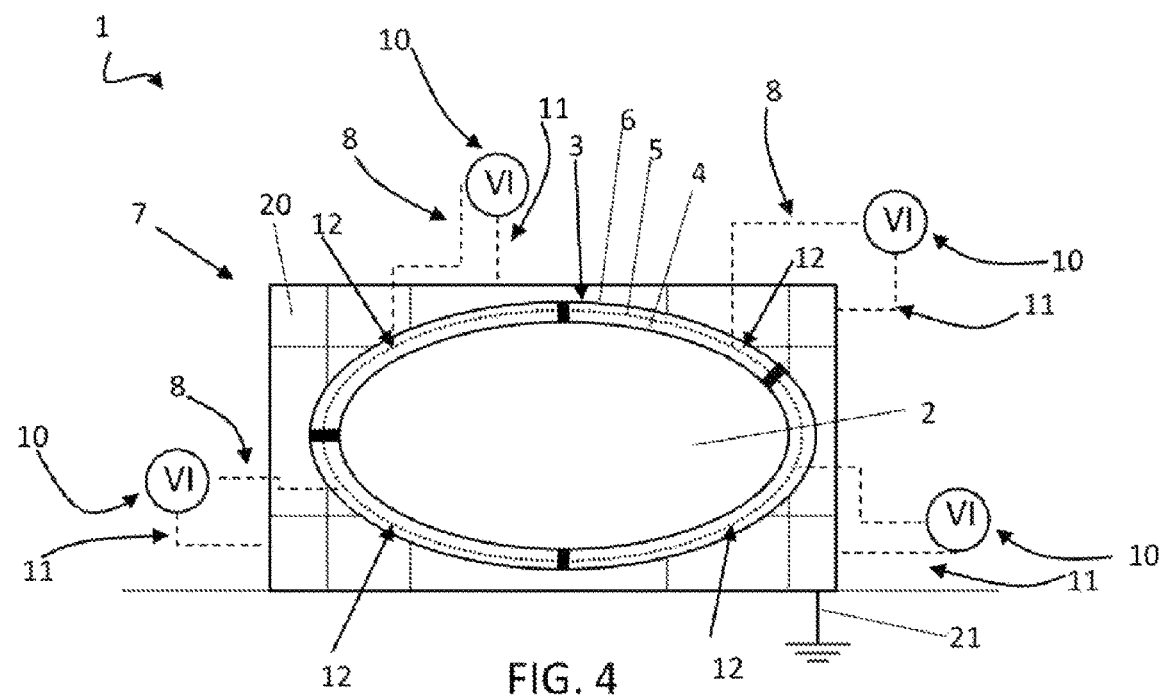
FIG. 4 shows a diagrammatic view relating to a third embodiment of the present invention.

According to an embodiment, as shown in FIG. 4, the intermediate electric conductive layer 5 comprises a plurality of sectors 12 which are electrically insulated from one another. In other words, the intermediate electric conductive layer 5 may be a discontinuous layer which has a plurality of sectors 12 which are electrically insulated both peripherally from one another and with respect to the working liquid 2 in contact with the internal electrical insulating layer 4, and with respect to the sea water in contact with the external electrical insulating layer 6.

According to an embodiment, the underwater storage tank 1 comprises a first electrical connection means 8 for each sector 12 of the plurality of electrically insulated sectors.

According to an embodiment, each sector 12 of the plurality of sectors 12 is connected to a respective first electrical connection means 8.

In particular, each respective first electrical connection means 8 is connectable to at least one electrical grounded measurement instrument 10 to assess the physical integrity of the flexible multilayer tank 3 at the corresponding sector 12 to which the respective first connection means 8 is connected.

In other words, each sector 12 of the plurality of sectors 12 of the intermediate layer 5 is electrically connectable, by means of the respective first electrical connection means 8, to the positive pole of one or of a respective electrical measurement instrument 10, and such an electrical measurement instrument 10 in turn is electrically connected to a grounding system 21 with the negative pole thereof.

A loss of integrity of the external electrical insulating layer 6 may be detected and spatially localized due to the fact that the intermediate electric conductive layer 5 comprises said plurality of sectors 12, in which each sector is electrically connectable to an electrical grounded measurement instrument 10 by means of a respective first electrical connection means 8.

According to a further aspect, the working liquid 2 is a solution of conductive liquid or a mixture of conductive liquids.

According to a further aspect, the underwater storage tank 1 comprises at least one electrode 14 in contact with the working liquid 2.

According to a further aspect, the underwater storage tank comprises at least a second electrical connection means 9 connected to the second electrode 14.

In particular, the second electrical connection means 9 is connectable to a measurement instrument 10 electrically connected with the intermediate conductive layer 5 to assess the physical integrity of the flexible tank 3.

According to an embodiment, said at least one measurement instrument 10 comprises a positive electric terminal and a negative electric terminal.

According to an embodiment, the positive electric terminal is electrically connected to the intermediate electric conductive layer 5 and the negative electric terminal is electrically connected to the conductive working liquid 2.

Figure 6:
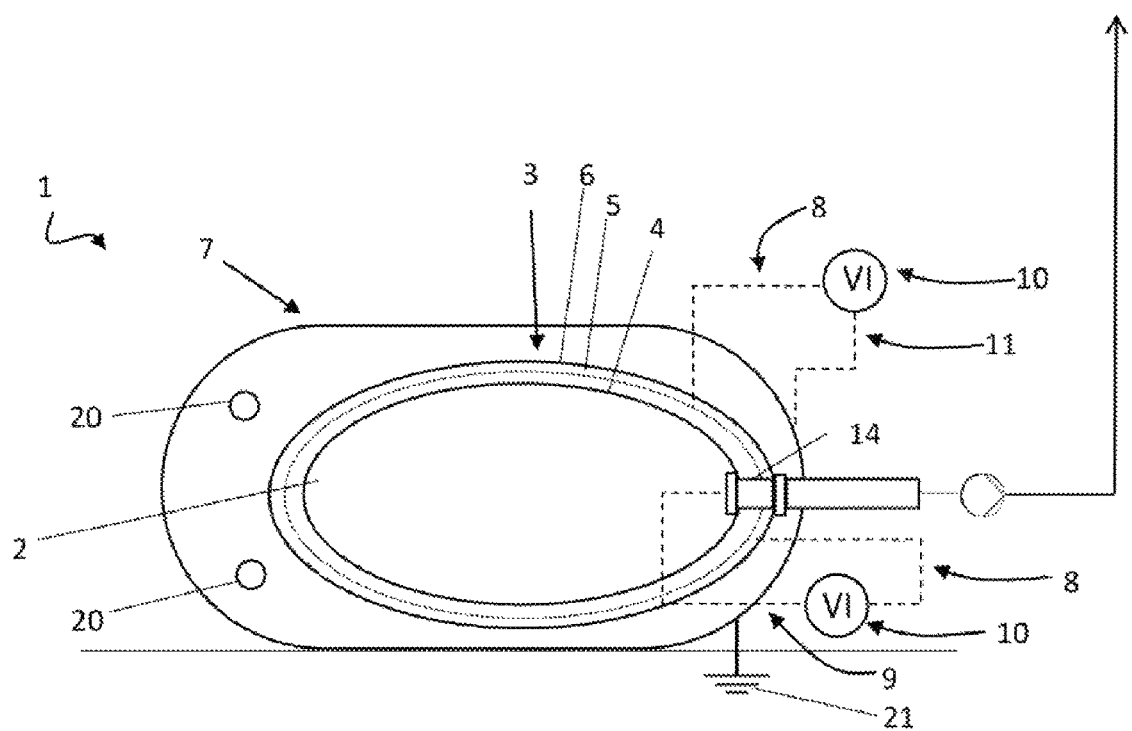
FIG. 6 shows a diagrammatic view relating to a fifth embodiment of the present invention.

According to an embodiment, said electrode 14 is, e.g. a flange, as shown in FIG. 6.

Advantageously, a loss of integrity of the inner layer 4 of the flexible multilayer tank 3 puts the intermediate electric conductive layer 5 in direct electrical connection with the conductive working liquid 2, and therefore, a variation of the insulating resistance of the internal electrical insulating layer 4 may be detected, and accordingly said loss of integrity of the flexible multilayer tank 3 may be detected by means of said measurement instrument 10 connectable by means of said second electrical connection means 9 to said electrode 14 and electrically connected to said intermediate electric conductive layer 5.

Moreover, the detection of a loss of integrity of the external electrical insulating layer 6 by means of a grounded electrical measurement instrument 10 electrically connected to the intermediate electric conductive layer 5 in conjunction with the detection of a loss of integrity of the internal electrical insulating layer 4 by means of a further electrical measurement instrument 10 or the same measurement instrument 10 connected to the intermediate electric conductive layer 5 and electrically connected to electrode 14 advantageously allows also a possible dispersion of said conductive working liquid 2 to be detected in the marine environment.

According to an aspect of the invention, the underwater storage tank 1 comprises a rigid containment structure 7 in which the flexible multilayer tank 3 is contained.

In particular, the rigid structure 7 comprises at least one bathymetric compensation opening 20 for the passage of sea water capable of compensating for the variation of internal pressure of the flexible multilayer tank 3 due to a withdrawal of the working fluid 2.

According to an aspect of the invention, the underwater storage tank 1 comprises at least one grounding system 21 and at least one third electrical connection means 11 electrically connected to said grounding system 21.

In particular, the third electrical connection means 11 is connectable to an electrical measurement instrument 10 electrically connected with said intermediate conductive layer 5 by means of said first electrical connection means 8 to assess the physical integrity of said flexible tank 3.

According to an embodiment, the rigid structure 7 may be completely metal and grounded by means of the grounding system 21, or made partially of non-conductive material such as, for example a tank made of composite material (e.g. a resin reinforced with fiberglass) which has portions of conductive material which are integral with the non-conductive rigid structure and grounded by means of the grounding system 21.

According to an embodiment, the at least a third electrical connection means 11 is grounded by means of the rigid structure connected to the grounding system 21. According to an aspect of the invention, the internal electrical insulating layer 4 is made of a first material chemically compatible with the working liquid 2.

According to an embodiment, said first material chemically compatible with the working liquid 2 is a fluorinated polymer.

In particular, such a fluorinated polymer is a polymer of the family of fluorinated elastomers known with the acronym FKM according to the international abbreviation ISO 1629.

For example, such a fluorinated polymer may be one of the following polymers known commercially as Viton® (DuPont), Dyneon® (3M), Tecnoflon® (Solvay), Dai-El® (Daikin).

According to an embodiment, said first material chemically compatible with the working liquid 2 is a rubber.

In particular, such a rubber is an elastomeric rubber, which may be IIR (monomer isobutene-isoprene) or EPDM (monomer ethylene-propylene-diene) or SBR (monomer styrene-butadiene).

According to a further aspect, the external electrical insulating layer 6 is made of a second material chemically compatible with the sea water. According to an embodiment, the second material chemically compatible with the sea water is a synthetic rubber known with the abbreviation CSM (chlorosulphonated polyethylene) according to the international abbreviation ISO 1629, which is commercially known as Hypalon® (DuPont Performance Elastomers), or a rubber made of IIR (monomer isobutene-isoprene) or EPDM (monomer ethylene-propylene-diene).

According to an aspect, the intermediate electric conductive layer 5 is a mechanical reinforcing layer. In other words, the intermediate layer 5 also acts as mechanical support for the flexible multilayer tank 3 and as outer protective element of the internal electrical insulating layer 4.

According to an embodiment, the intermediate electric conductive layer 5 is a flexible metal sheet.

According to an embodiment, said flexible sheet is a continuous sheet.

According to an embodiment, said flexible sheet is a discontinuous sheet.

According to an embodiment, said flexible metal sheet has a maximum thickness of 0.1 mm.

According to an embodiment, said flexible metal sheet is made of aluminum.

According to an embodiment, the intermediate electric conductive layer 5 is a conductive wire mesh.

According to an embodiment, such a conductive wire mesh is a metal wire mesh or a conductive fiber wire mesh.

According to an embodiment, said metal wire mesh is a copper wire mesh.

According to an embodiment, said conductive fiber metal wire mesh is a mesh made at least of carbon fiber.

According to an embodiment, the intermediate electric conductive layer 5 is made in the form of a fabric comprising at least one carbon fiber.

According to an embodiment, the intermediate electric conductive layer 5 may consist only partially of electric conductive material; for example, it may be represented by a polyester fiber fabric alternated with conductive material fibers.

According to an embodiment, the intermediate electric conductive layer 5 may consist of non-conductive base material, such as, e.g. polyester, which is made conductive through a specific treatment; in this regard, suitable treatments may include: spraying, electroless plating, sputter coating, plasma treatments, vacuum metallizing, polymerization in situ, chemical vapor deposition, textile coating/printing.

According to an embodiment, the intermediate electric conductive layer 5 may consist of a polymer, such as e.g. nitrile butadiene rubber (NBR), loaded with carbon particles/fibers or an equivalent conductive material which gives the polymeric layer electro-conductive properties.

According to an embodiment, the rigid containment structure 7 is a support and protective structure of the flexible multilayer tank 3, for example in the laying, working liquid 2 withdrawal and recovery steps.

According to an embodiment, the rigid containment structure 7 is an anchoring structure of the flexible multilayer tank 3. The underwater storage tank 1 therefore is anchored to the seabed, or to a bed of a different body of water such as a lake, a river, or an artificial reservoir.

According to an embodiment, the rigid structure 7 peripherally surrounds said flexible multilayer tank 3. Thereby, an electrical measurement instrument 10 connected to the intermediate electric conductive layer 5 and connected to the grounding system 21 or electrode 14 detects a loss of integrity in any position of said leak of the flexible multilayer tank 3.

According to an embodiment, such as, for example shown in FIG. 4, the rigid structure 7 is made like a metal cage having at least one mesh structure and comprises a plurality of openings 20. Therefore, the sea water is free to come into contact with the flexible multilayer tank 3, avoiding any differences in pressure.

According to an embodiment, the rigid structure 7 has a rigid box-like or cylindrical tank shape comprising at least one inlet path 20 to allow the inlet of sea water therein and therefore to come into contact with the flexible multilayer tank 3.

Figure 2:
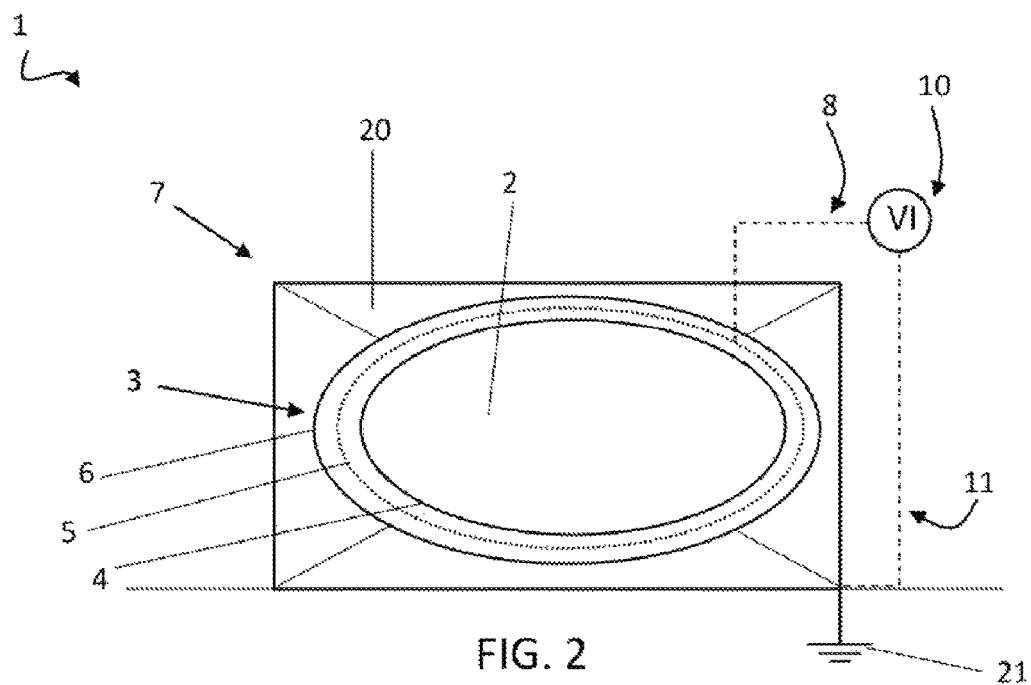
FIG. 2 shows a diagrammatic view relating to a first embodiment of the present invention.

According to an embodiment, such as, for example shown in FIG. 2, the rigid structure 7 has a frame shape comprising cross members and peripheral uprights.

According to an embodiment, said at least one measurement instrument 10 is any system capable of measuring and identifying a loss of electrical insulation.

In particular, said at least one measurement instrument 10, e.g. a megohmmeter, or a multimeter which comprises a megohmmeter.

According to an embodiment, said at least one measurement instrument 10 is positioned close to the rigid containment structure 7.

According to an embodiment, said at least one measurement instrument 10 is integrated in a subsea electronic module or in a subsea control module 17 of known type with which said storage tank 1 is provided.

According to an embodiment, each electrical connection means 8, 9, 11 is in the form of an underwater electrical connection cable.

According to an embodiment, each electrical connection means 8, 9, 11 has a connector connected to a subsea electronic module or to a subsea control module 17 of known type with which the underwater storage tank 1 is provided.

According to an embodiment, said at least one measurement instrument 10 is connectable to the respective connectors of the electrical connection means 8, 9, 11 in the subsea electronic module or in a subsea control module 17 of known type with which said storage tank 1 is provided.

According to an embodiment, said at least one measurement instrument 10 is housed or integrated in an AUV (autonomous underwater vehicle) or an ROV (remotely operated vehicle).

According to an embodiment, the underwater storage tank 1 comprises at least one visual inspection means, such as for example at least one camera. Thereby, the state of integrity of said storage tank 1 may be visually monitored.

According to a second object, the present invention relates to an assessment system of the physical integrity of an underwater storage tank which comprises said underwater storage tank 1 described in the present description, and at least one electrical measurement instrument 10 described above, to assess the physical integrity of the flexible multilayer tank 3.

In particular, said at least one electrical measurement instrument 10 is connectable and/or electrically connected at least to the intermediate electric conductive layer 5 of the flexible multilayer tank 3 and to one between an electrical grounding system 21 and said working liquid 2.

According to a third object, the present invention describes a method for detecting a loss of physical integrity of an underwater storage tank 1 for a working liquid 2 by means of a detection system described above, in which said underwater storage tank 1 comprises a flexible multilayer tank 3 containing said working liquid 2, said flexible multilayer tank 3 being externally in contact with sea water, said flexible multilayer tank 3 comprising at least one internal electrical insulating layer 4 in contact with said working fluid 2, at least one external electrical insulating layer 6 in contact with sea water, at least one intermediate electric conductive layer 5 sealed between said at least one internal electrical insulating layer 4 and said at least one external electrical insulating layer 6, at least one first electrical connection means 8 connected to said intermediate conductive layer 5, said first electrical connection means 8 being electrically connectable and/or connected to said at least one electrical grounded measurement instrument 10 to assess the physical integrity of said flexible tank 3.

Such a method comprises the following steps:
storing at least one insulation resistance threshold value (Rse) of said external electrical insulating layer (6) corresponding to a loss of integrity of said flexible multilayer tank (3),
detecting a current insulation resistance value (Re) of said external electrical insulating layer (6),
comparing said current insulation resistance value (Re) with said insulation resistance threshold value (Rse),
sending a warning signal (Se) for an external loss of integrity of said underwater tank (1) if said current insulation resistance value (R) detected is lower than said insulation resistance threshold value (Rse).

According to a fourth object, the present invention relates to a further method for detecting a loss of physical integrity of an underwater storage tank 1 of a working liquid 2 by means of a detection system described above, in which said underwater storage tank 1 comprises a flexible multilayer tank 3 containing said working liquid 2, said flexible multilayer tank 3 being externally in contact with sea water, said flexible multilayer tank 3 comprising at least one internal electrical insulating layer 4 in contact with said working fluid 2, at least one external electrical insulating layer 6 in contact with sea water, at least one intermediate electric conductive layer 5 sealed between said at least one internal electrical insulating layer 4 and said at least one external electrical insulating layer 6, in which said intermediate electric conductive layer 5 comprises a plurality of sectors 12 electrically insulated therebetween and in which each sector 12 of said plurality of sectors 12 is connected to a respective first electrical connection means 8, each respective first electrical connection means 8 being connectable to said at least one electrical grounded measurement instrument 10 to assess the physical integrity of said flexible tank 3 at the corresponding sector 12 to which said respective first connection means 8 is connected.

Such a method comprises the steps of:
storing at least one insulation resistance threshold value (Rse) of said external electrical insulating layer 6 corresponding to a loss of integrity of said flexible multilayer tank 3,
detecting a current sector insulation resistance value (Rsci) of said external electrical insulating layer 6 at each sector 12 of said plurality of sectors 12,
comparing each current sector insulation resistance value Rsci detected with said insulation resistance threshold value Rse of said external electrical insulating layer 6,
sending a localized warning signal (Sel) for an external loss of integrity of said underwater tank 1 for each current sector insulation resistance value (Rsci) detected which is lower than said insulation resistance threshold value Rs.

If said working liquid 2 is a conductive liquid, and if said underwater tank 1 comprises at least one electrode 14 in contact with said working liquid 2 and at least one second electrical connection means 9 connected to said electrode 14, said second electrical connection means 9 being electrically connectable and/or connected to said at least one measurement instrument 10 electrically connected to said intermediate conductive layer 5 to assess the physical integrity of said flexible tank 3, such methods comprise the further following steps:

- storing at least one insulation resistance threshold value (Rsi) of said internal electrical insulating layer 4 corresponding to a loss of integrity of said flexible multilayer tank 3,
- detecting a current insulation resistance value (Ri) of said internal electrical insulating layer 4,
- comparing said current insulation resistance value (Ri) with said insulation resistance threshold value (Rsi),
- sending a warning signal (Si) for an internal loss of integrity of said underwater tank 1 if said current insulation resistance value (Ri) detected is lower than said insulation resistance threshold value (Rsi).

The invention and some particular embodiments thereof are better described in the following non-limiting examples.

Example 1

Employment of a Megohmmeter

With reference to FIG. 2, an underwater storage tank 1 of a working liquid 2 positioned on a seabed is shown. The underwater storage tank 1 comprises a flexible multilayer tank 3 having a shape of a cushion of the volume of 30 m3 and a rigid containment structure 7 grounded by means of a grounding system 21. The rigid structure 7 is a metal rigid structure in the shape of a box-like frame; it has uprights and cross members along the perimeter thereof and supports the flexible multilayer tank 3. The flexible multilayer tank 3 is filled with a solution containing a non-conductive organic solvent 2. The flexible multilayer tank 3 comprises an internal electrical insulating layer 4 consisting of an FKM membrane in contact with the organic solvent 2 and an external electrical insulating layer 6 consisting of a Hypalon® rubber membrane in contact with the sea water. An intermediate electric conductive layer 5 consisting of a carbon fiber fabric is sealingly positioned in between the two membranes 4, 6. The underwater storage tank 1 comprises a first electrical connection means 8 connected to the carbon fiber fabric 5 and connected to a measurement instrument 10 in the form of a megohmmeter. The underwater storage tank 1 comprises a third electrical connection means 11 connected to said rigid structure 7 and connected to said measurement instrument in the form of a megohmmeter. The megohmmeter has a positive pole connected to the carbon fiber fabric 5 and a negative pole connected to the grounded rigid metal structure 7 which supports the flexible multilayer tank 3.

If the carbon fiber fabric 5 comes into contact with the sea water due, for example to a gap in the Hypalon® outer layer 6, the electrical insulation of the carbon fiber fabric 5 is compromised and megohmmeter 9 signals a reduction of the insulation resistance measured due to a passage of electrons and a subsequent reduction of the physical integrity of the flexible multilayer tank 3.

When a loss of physical integrity of the flexible tank 3 is detected, a visual inspection may be scheduled to assess whether or not to recuperate the underwater storage tank 1 and replace it or make other provisions prior to a dispersion event of the working liquid 2 into the marine environment.

Example 2

Employment of a First Megohmmeter and a Second Megohmmeter

Figure 3:
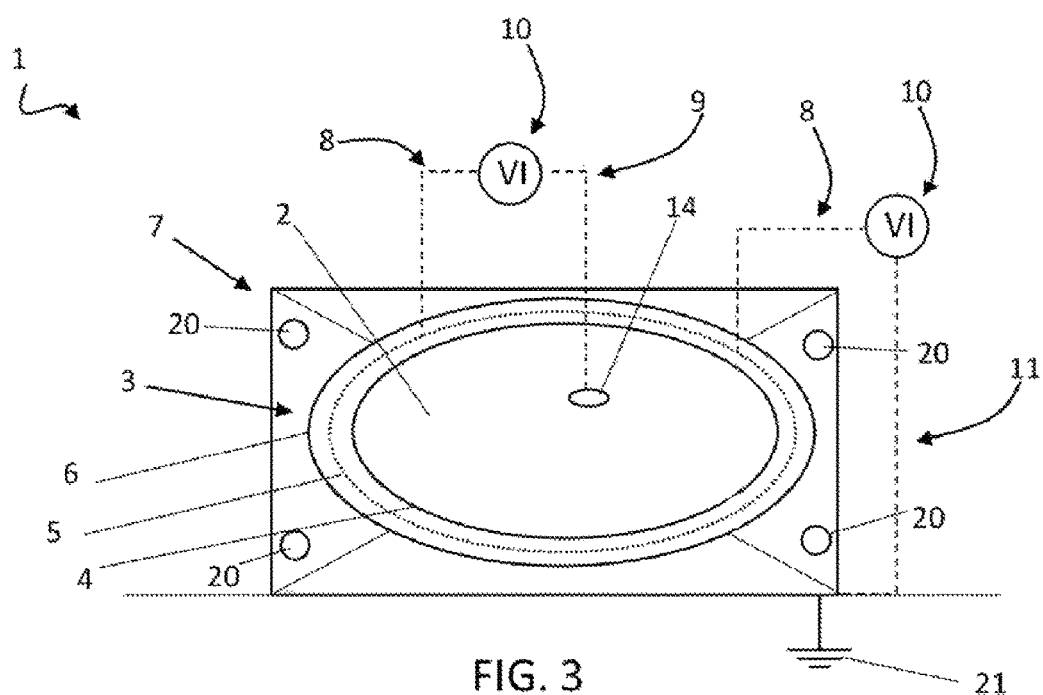
FIG. 3 shows a diagrammatic view relating to a second embodiment of the present invention.

With reference to FIG. 3, an underwater storage tank 1 of a working liquid 2 anchored on a seabed is shown. The underwater storage tank 1 comprises a flexible multilayer tank 3 having a shape of a cushion and a bathymetrically compensated rigid containment structure 7 connected to a grounding system 21. The rigid structure 7 is in the form of a metal crate inside of which the flexible multilayer tank 3 is positioned. The metal crate 7 has circular openings 20 to allow the sea water to enter therein and externally surround the flexible multilayer tank 3. The flexible multilayer tank 3 is filled with an aqueous solution in which a polar oligomer 2 is dissolved, therefore solution 2 is conductive. The flexible multilayer tank 3 comprises an internal electrical insulating layer 4 consisting of an IIR rubber membrane in contact with the polar solution and an external electrical insulating layer 6 consisting of an IIR rubber membrane in contact with the sea water. An intermediate electric conductive layer 5 consisting of a carbon fiber fabric is sealingly positioned in between the two membranes 4, 6. The underwater storage tank 1 comprises a first electrical connection means 8 connected to said flexible multilayer tank 3 and a third connection means 11 connected to said metal crate 7, both connected to a first measurement instrument 10 in the form of a first megohmmeter; moreover, the underwater storage tank comprises a further first electrical connection measurement means 8 connected to said flexible multilayer tank 3 and a second electrical connection means 9 connected to an electrode 14 in contact with the working liquid 2, both connected to a second measurement instrument 10 in the form of a second megohmmeter. The first megohmmeter has a positive pole connected to the carbon fiber fabric 5 and a negative pole connected to the metal crate 7. The second megohmmeter has a positive pole connected to the carbon fiber fabric 5 and a negative pole connected to the polar solution 2 by means of electrode 14.

If the carbon fiber fabric 5 comes into contact with the sea water due, for example to a gap in the outer IIR layer 6, the electrical insulation of the carbon fiber fabric 5 is compromised and the first megohmmeter signals a passage of electrons and a subsequent reduction of the physical integrity of the flexible multilayer tank 3.

If instead the carbon fiber fabric 5 comes into contact with the polar aqueous solution 2 due to a break of the inner IIR membrane 4, the second megohmmeter signals a passage of electrons and a subsequent reduction of the physical integrity of the flexible multilayer tank 3.

Example 3

Employment of a Plurality of Megohmmeters

With reference to FIG. 4, an underwater storage tank 1 of a working liquid 2 positioned on a seabed is shown. The underwater storage tank 1 comprises a flexible multilayer tank 3 having a shape of a cushion and a bathymetrically compensated rigid containment structure 7 connected to a grounding system 21. The rigid structure 7 is in the form of a reticular grid inside of which the flexible multilayer tank 3 is positioned. The flexible multilayer tank 3 is filled with a hydroalcoholic solution 2. The flexible multilayer tank 3 comprises an internal electrical insulating layer 4 consisting of an IIR rubber membrane in contact with the hydroalcoholic solution 2 and an external electrical insulating layer 6 consisting of an EPDM rubber membrane in contact with the sea water. An intermediate electric conductive layer 5 consisting of a thin aluminum film is sealingly positioned in between the two membranes 4, 5. The thin aluminum film 5 is divided into a plurality of separate sectors 12 which are electrically insulated from one another. The underwater storage tank 1 comprises a plurality of first electrical connection means 8 connected to said flexible multilayer tank 3 and a respective plurality of third electrical connection means 11 connected to the metal grid 7. Each pair of first electrical connection means 8 and third electrical connection means is connected to a respective measurement instrument 10 in the form of a megohmmeter, each connected with the positive pole thereof to a respective sector of the plurality of sectors 12 of the aluminum film 5 and connected with the negative pole thereof to the metal grid 7.

If one of the sectors of the plurality of sectors 12 of the aluminum film 5 comes into contact with the sea water, the megohmmeter connected to such a sector 12 signals a passage of electrons and a subsequent reduction of the physical integrity of the flexible multilayer tank 3.

Thereby, the zone in which the integrity of the flexible tank 3 was reduced may be localized and an on-site repair may be scheduled.

Moreover, each measurement instrument 10 depicted could be the same measurement instrument 10 housed in or integrated with an autonomous or remotely controlled subsea vehicle which connects each time to a respective pair of first electrical connection means 8 and of third electrical connection means 11 to measure the electrical insulation of a corresponding sector 12.

Example 4

A Megohmmeter and Metal Conductive Mesh

Figure 5:
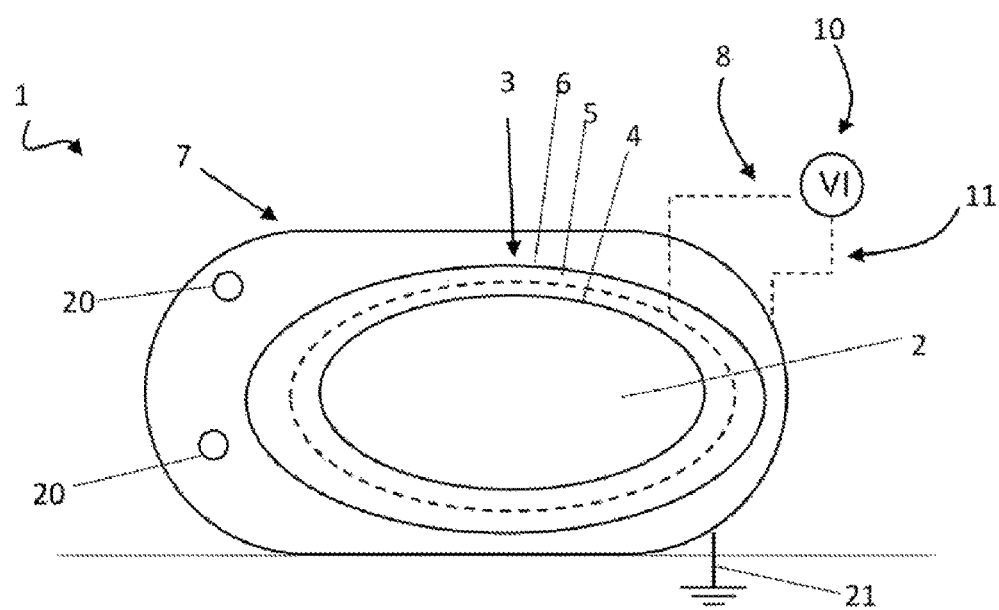
FIG. 5 shows a diagrammatic view relating to a fourth embodiment of the present invention.

With reference to FIG. 5, an underwater storage tank 1 of a working liquid 2 positioned on a seabed is shown. The underwater storage tank 1 comprises a flexible multilayer tank 3 having a cylindrical shape and a bathymetrically compensated rigid containment structure 7 connected to a grounding system 21. The rigid structure 7 is in the form of a cylindrical metal tank inside of which the flexible multilayer tank 3 is positioned. The cylindrical metal tank 7 has openings 20 to allow the sea water to enter therein and externally come into contact with the flexible multilayer tank 3. The flexible multilayer tank 3 is filled with a non-conductive organic solution 2. The flexible multilayer tank 3 comprises an internal electrical insulating layer 4 consisting of a fluorinated FKM membrane in contact with the organic solvent 2 and an external electrical insulating layer 6 consisting of an IIR rubber membrane in contact with the sea water. An intermediate electric conductive layer 5 consisting of a metal mesh made of copper wires is sealingly positioned in between the two membranes. The underwater storage tank 1 comprises a first electrical connection means 8 connected to the intermediate electric conductive layer 5 and a third electrical connection means 11 connected to the cylindrical metal tank 7, both connected to a measurement instrument 10 in the form of a megohmmeter. The megohmmeter has a positive pole connected to the copper mesh 5 and a negative pole connected to the rigid structure 7 inside of which the flexible multilayer tank 3 is positioned.

If the copper mesh 5 comes into contact with the sea water due, for example to a gap in the outer IIR layer 6, the electrical insulation of the copper mesh 5 is compromised and the megohmmeter signals a loss of insulation due to a passage of electrons and a subsequent reduction of the physical integrity of the flexible multilayer tank 3.

When a loss of physical integrity of the flexible tank 3 is detected, a visual inspection may be scheduled to assess whether or not to recuperate the underwater storage tank 1 and replace it or replace it on site.

Example 5

Metal Sheet, a First Megohmmeter and a Second Megohmmeter

As depicted in FIG. 6, an underwater storage tank 1 of a working liquid 2 positioned on a seabed is shown. The underwater storage tank 1 comprises a flexible multilayer tank 3 having a cylindrical shape and a bathymetrically compensated rigid containment structure 7 connected to a grounding system 21. The rigid structure 7 is in the form of a cylindrical metal tank inside of which the flexible multilayer tank 3 is positioned. The cylindrical metal tank 7 has circular openings 20 to allow the sea water to enter therein and externally surround the flexible multilayer tank 3. The flexible multilayer tank 3 is filled with an aqueous, electrically conductive sodium phosphate solution 2.

The flexible multilayer tank 3 comprises an internal electrical insulating layer 4 consisting of an EPDM membrane in contact with the aqueous sodium phosphate solution 2 and an external electrical insulating layer 6 consisting of a Hypalon® rubber membrane in contact with the sea water. An intermediate electric conductive layer 5 consisting of thin aluminum film (maximum thickness of 0.1 mm) is sealingly positioned in between the two membranes 4, 6. The underwater storage tank 1 comprises a first electrical connection means 8 connected to the thin aluminum film and a third electrical connection means 11 connected to the metal rigid structure 7, both connected to a first measurement instrument 10 in the form of a first megohmmeter, and the underwater storage tank 1 comprises a further first electrical connection means 8 connected to the thin aluminum sheet 5 and a second electrical connection means 9 connected to an electrode 14 (in the form of a flange), both connected to a second measurement instrument 10 in the form of a second megohmmeter. The first megohmmeter has a positive pole connected to the thin aluminum film 5 and a negative pole connected to the cylindrical metal tank 7. The second megohmmeter has a positive pole connected to the thin aluminum film 5 and a negative pole connected with the aqueous sodium phosphate solution 2 by means of the flange.

If the thin aluminum film 5 comes into contact with the sea water due, for example to a gap in the outer EPDM layer 6, the electrical insulation of the thin aluminum film 5 is compromised and the first megohmmeter signals a loss of insulation due to a passage of electrons and a subsequent reduction of the physical integrity of the flexible multilayer tank 3. If instead the thin aluminum film 5 comes into contact with the electrically conductive solution 2 due to a break of the inner Hypalon® membrane 4, the second megohmmeter signals a loss of electrical insulation due to a passage of electrons and a subsequent reduction of the physical integrity of the flexible multilayer tank 3.

If the both first megohmmeter and the second megohmmeter signal a passage of electrons, a possible gapping of the flexible multilayer tank 3 is detected and it is possible to intervene to recuperate the underwater storage tank 1 to limit possible dispersions of the electrically conductive solution into the marine environment.

What is claimed is:

1. An underwater storage tank for a working liquid, said underwater storage tank comprising
a flexible multilayer tank containing said working liquid, said flexible multilayer tank being externally in contact with sea water,
wherein said flexible multilayer tank comprises
at least one internal electrical insulating layer in contact with said working liquid,
at least one external electrical insulating layer in contact with said sea water,
at least one intermediate electric conductive layer sealed between said at least one internal electrical insulating layer and said at least one external electrical insulating layer,
at least one first electrical connection means connected to said at least one intermediate electric conductive layer, said at least one first electrical connection means being connectable to an electrical grounded measurement instrument to assess physical integrity of said flexible multilayer tank.

2. The underwater storage tank of claim 1, wherein said at least one intermediate electric conductive layer comprises a plurality of sectors electrically insulated therebetween, and wherein each sector of said plurality of sectors is connected to a respective first electrical connection means, each respective first electrical connection means being connectable to said electrical grounded measurement instrument to assess physical integrity of said flexible multilayer tank at the sector to which said respective first connection means is connected.

3. The underwater storage tank of claim 1, wherein said working liquid is a conductive liquid, and wherein said underwater storage tank comprises at least one electrode in contact with said working liquid, and at least one second electrical connection means connected to said at least one electrode, said at least one second electrical connection means being connectable to said electrical grounded measurement instrument electrically connected to said at least one intermediate electric conductive layer to assess physical integrity of said flexible multilayer tank.

4. The underwater storage tank of claim 1, further comprising a rigid containment structure housing said flexible multilayer tank, wherein said rigid containment structure comprises at least one bathymetric compensation opening for passage of sea water capable of compensating for variation of internal pressure of said flexible multilayer tank due to a withdrawal of the working liquid.

5. The underwater storage tank of claim 1, comprising at least one grounding system and at least one third electrical connection means electrically connected to said at least one grounding system, said at least one third electrical connection means being connectable to said electrical grounded measurement instrument electrically connected to said at least one intermediate electric conductive layer by said at least one first electrical connection means to assess physical integrity of said flexible multilayer tank.

6. The underwater storage tank of claim 1, wherein said at least one internal electrical insulating layer is made of a first material which is chemically compatible with said working liquid.

7. The underwater storage tank of claim 1, wherein said at least one external electrical insulating layer is made of a second material which is chemically compatible with sea water.

8. The underwater storage tank of claim 1, wherein said at least one intermediate electric conductive layer is one of an electrically conductive wire mesh, a fabric comprising carbon fiber, a carbon fiber wire mesh, and a flexible metal sheet.

9. A system for assessing physical integrity of an underwater tank, said system comprising
an underwater storage tank for a working liquid, said underwater storage tank comprising
a flexible multilayer tank containing said working liquid, said flexible multilayer tank being externally in contact with sea water, wherein said flexible multilayer tank comprises
at least one internal electrical insulating layer in contact with said working liquid,
at least one external electrical insulating layer in contact with sea water,
at least one intermediate electric conductive layer sealed between said at least one internal electrical insulating layer and said at least one external electrical insulating layer,
at least one first electrical connection means connected to said at least one intermediate electric conductive layer, said at least one first electrical connection means being connectable to an electrical grounded measurement instrument to assess physical integrity of said flexible multilayer tank,
and at least one electrical grounded measurement instrument for assessing physical integrity of said flexible multilayer tank, said at least one electrical grounded measurement instrument being connectable and/or electrically connected at least to said at least one intermediate electric conductive layer of said flexible multilayer tank and to one between an electrical grounding system and said working liquid.

10. A method for detecting a loss of physical integrity of an underwater storage tank for a working liquid by system for assessing physical integrity of an underwater tank, said system comprising
an underwater storage tank for a working liquid, said underwater storage tank comprising
a flexible multilayer tank containing said working liquid, said flexible multilayer tank being externally in contact with sea water, wherein said flexible multilayer tank comprises
at least one internal electrical insulating layer in contact with said working liquid,
at least one external electrical insulating layer in contact with sea water,
at least one intermediate electric conductive layer sealed between said at least one internal electrical insulating layer and said at least one external electrical insulating layer,
at least one first electrical connection means connected to said at least one intermediate electric conductive layer,
and at least one electrical grounded measurement instrument connectable to said at least one first electrical connection, said at least one electrical grounded measurement instrument for assessing physical integrity of said flexible multilayer tank, said at least one electrical grounded measurement instrument being connectable and/or electrically connected at least to said at least one intermediate electric conductive layer of said flexible multilayer tank and to one between an electrical grounding system and said working liquid, said method comprising:
- storing an insulation resistance threshold value of said at least one external electrical insulating layer corresponding to a loss of integrity of said flexible multilayer tank,
- detecting a current insulation resistance value of said at least one external electrical insulating layer,
- comparing said current insulation resistance value of said at least one external electrical insulating layer with said insulation resistance threshold value of said at least one external electrical insulating layer, and
- sending a warning signal for an external loss of integrity of said underwater storage tank if said current insulation resistance value of said at least one external electrical insulating layer is lower than said insulation resistance threshold value of said at least one external electrical insulating layer.

11. The method of claim 10, wherein said working liquid is a conductive liquid, and wherein said underwater storage tank comprises at least one electrode in contact with said working liquid, and at least one second electrical connection means connected to said at least one electrode, said at least one second electrical connection means being electrically connectable to said at least one electrical grounded measurement instrument electrically connected to said at least one intermediate electric conductive layer to assess physical integrity of said flexible multilayer tank, said method comprising:
- storing an insulation resistance threshold value of said at least one internal electrical insulating layer corresponding to a loss of integrity of said flexible multilayer tank,
- detecting a current insulation resistance value of said at least one internal electrical insulating layer,
- comparing said current insulation resistance value of said at least one internal electrical insulating layer with said insulation resistance threshold value of said at least one internal electrical insulating layer, and
- sending a warning signal for an internal loss of integrity of said underwater storage tank if said current insulation resistance value of said at least one internal electrical insulating layer is lower than said insulation resistance threshold value of said at least one internal electrical insulating layer.

12. A method for detecting a loss of physical integrity of an underwater storage tank for a working liquid by a system for assessing physical integrity of an underwater tank, said system comprising
an underwater storage tank for a working liquid, said underwater storage tank comprising
a flexible multilayer tank containing said working liquid, said flexible multilayer tank being externally in contact with sea water, wherein said flexible multilayer tank comprises
at least one internal electrical insulating layer in contact with said working liquid,
at least one external electrical insulating layer in contact with sea water,
at least one intermediate electric conductive layer sealed between said at least one internal electrical insulating layer and said at least one external electrical insulating layer,
at least one first electrical connection means connected to said at least one intermediate electric conductive layer,
and at least one electrical grounded measurement instrument connectable to said at least one first electrical connection, said at least one electrical grounded measurement instrument for assessing physical integrity of said flexible multilayer tank, said at least one electrical grounded measurement instrument being connectable and/or electrically connected at least to said at least one intermediate electric conductive layer of said flexible multilayer tank and to one between an electrical grounding system and said working liquid,
wherein said at least one intermediate electric conductive layer comprises a plurality of sectors electrically insulated therebetween and wherein each sector of said plurality of sectors is connected to a respective first electrical connection means, each respective first electrical connection means being connectable to said at least one electrical grounded measurement instrument to assess physical integrity of said flexible multilayer tank at the sector to which said respective first connection means is connected, said method comprising:
- storing an insulation resistance threshold value of said at least one external electrical insulating layer corresponding to a loss of integrity of said flexible multilayer tank,
- detecting a current sector insulation resistance value of said at least one external electrical insulating layer at each sector of said plurality of sectors,
- comparing each current sector insulation resistance value with said insulation resistance threshold value of said at least one external electrical insulating layer, and
- sending a warning signal for a localized external loss of integrity of said underwater storage tank for each current sector insulation resistance value lower than said insulation resistance threshold value of said at least one external electrical insulating layer.

13. The method of claim 12, wherein said working liquid is a conductive liquid, and wherein said underwater storage tank comprises at least one electrode in contact with said working liquid, and at least one second electrical connection means connected to said at least one electrode, said at least one second electrical connection means being electrically connectable to said at least one electrical grounded measurement instrument electrically connected to said at least one intermediate electric conductive layer to assess physical integrity of said flexible multilayer tank, said method comprising:
- storing an insulation resistance threshold value of said at least one internal electrical insulating layer corresponding to a loss of integrity of said flexible multilayer tank,
- detecting a current insulation resistance value of said at least one internal electrical insulating layer,
- comparing said current insulation resistance value of said at least one internal electrical insulating layer with said insulation resistance threshold value of said at least one internal electrical insulating layer, and
- sending a warning signal for an internal loss of integrity of said underwater storage tank if said current insulation resistance value of said at least one internal electrical insulating layer is lower than said insulation resistance threshold value of said at least one internal electrical insulating layer.

* * * * *